(12) United States Patent
Brown et al.

(10) Patent No.: US 9,551,619 B1
(45) Date of Patent: Jan. 24, 2017

(54) TERAHERTZ LASER

(75) Inventors: Robert G. Brown, Tustin, CA (US); James H. Stanley, Palo Alto, CA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1416 days.

(21) Appl. No.: 13/243,732

(22) Filed: Sep. 23, 2011

(51) Int. Cl.
*G01J 5/00* (2006.01)

(52) U.S. Cl.
CPC .................................. *G01J 5/00* (2013.01)

(58) Field of Classification Search
CPC ................. G01J 5/20; G01J 5/08; G01J 5/00; H01Q 9/00; H01L 31/00
USPC ...................................................... 250/338.1
See application file for complete search history.

(56) References Cited

U.S. PATENT DOCUMENTS

| | | | |
|---|---|---|---|
| 5,847,816 A * | 12/1998 | Zediker et al. | 356/5.09 |
| 6,014,249 A * | 1/2000 | Fermann et al. | 359/341.1 |
| 6,735,234 B1 * | 5/2004 | Paschotta et al. | 372/75 |
| 7,339,718 B1 * | 3/2008 | Vodopyanov et al. | 359/326 |
| 7,430,074 B2 | 9/2008 | Korenblit et al. | |
| 7,440,178 B2 | 10/2008 | Korenblit et al. | |
| 7,471,449 B2 | 12/2008 | Korenblit et al. | |
| 7,508,578 B2 | 3/2009 | Korenblit et al. | |
| 7,706,056 B2 | 4/2010 | Korenblit et al. | |
| 2005/0024716 A1* | 2/2005 | Nilsson et al. | 359/341.31 |
| 2010/0002739 A1* | 1/2010 | Hu et al. | 372/45.01 |
| 2011/0032598 A1* | 2/2011 | Horikawa et al. | 359/326 |
| 2011/0134942 A1* | 6/2011 | Karni et al. | 372/18 |

OTHER PUBLICATIONS

Cui et al., Optical gain and lasing of ZnO/ZnMgO multiple quantum wells: From low to room temperature; Aug. 2, 2006; Applied Physics Letters 89, 051108 (2006); doi: 10.1063/1.2266371; http://dx.doi.org/10.1063/1.2266371.*
U.S. Appl. No. 13/243,342, filed Sep. 23, 2011, Brown et al.

* cited by examiner

*Primary Examiner* — David Porta
*Assistant Examiner* — Gisselle Gutierrez
(74) *Attorney, Agent, or Firm* — Donna P. Suchy; Daniel M. Barbieri

(57) ABSTRACT

A pulsed emitter of electromagnetic radiation having a frequency range of 0.1 to 10 THz is described. The pulsed emitter includes an electromagnetic radiation gain medium and a pulse inducing element. The electromagnetic radiation gain medium is for generating electromagnetic radiation having the frequency range of 0.1 to 10 THz. The pulse inducing element is configured to induce an electromagnetic radiation pulse in the gain medium.

15 Claims, 4 Drawing Sheets

TERAHERTZ LASER

FIELD OF THE INVENTION

The present invention relates to a pulsed emitter of electromagnetic radiation in the THz frequency range, and to systems using such a pulsed emitter.

BACKGROUND

Lasers emitting in the THz frequency range of 0.1 to 10 THz are known. For example, U.S. Pat. Nos. 7,471,449, 7,508,578, 7,706,056, 7,430,074, and 7,440,178 to Korenblit and Tankhilevich describe magnon lasers which emit in the THz frequency range. In such magnon lasers, lasing is predicted to occur in a lasing medium of ferromagnetic semiconductor material involving spin-up and spin-down electrons in a classic 4 level sub-band laser structure [A. E. Siegman, 'Lasers', University Science Books, 1986.]. The magnon lasing emission occurs for transitions between the upper two sub-band. Above a certain threshold, annihilating non-equilibrium magnons will lase and produce THz radiation, whose intensity depends on the magnon collision rate.

Lasing is achieved by a balance between various length scales, the mean free path of electrons in the medium, the spin-wave wavelength, the sample dimensions, and the radiated wavelength. To lase, the ambient temperature must be below a critical temperature, where recent results have shown that with the right materials, the critical temperature may be as high as 850° C. In a one hundred layer magnon laser incorporating semiconductor magnon mirrors, the CW (continuous wave) power can be increased 100-fold, and yet the device thickness may be less than 4 microns.

Korenblit and Tankhilevich's own predictions for their CW magnon laser are for a threshold current exceeding 5000 Amps/cm$^2$, and employing 10-100 Watts of input electrical power, where it might be possible to extract ~10 mW of laser power for a single-stage laser and ~1 Watt for a 100 stage laser. The required threshold current and input electrical power for output laser power exceeds other known solid-stage lasers for this wavelength range, where wavelengths should be in the 0.2 to 2.0 THz region, with a laser line width of ~1 MHz.

Moreover, currently most powerful THz emitters are relatively feeble. Cooled Quantum Cascade Lasers (QCL) lasers emit microWatts of power, with the best prospects being mW. The best research-level MMICs emit only 50 mW of power at 0.22 THz.

SUMMARY

According to one embodiment, there is provided a pulsed emitter of electromagnetic radiation having a frequency range of 0.1 to 10 THz, comprising: an electromagnetic radiation gain medium for generating electromagnetic radiation having the frequency range of 0.1 to 10 THz; and a pulse inducing element configured to induce an electromagnetic radiation pulse in the gain medium.

DETAILED DESCRIPTION

Figure 1:
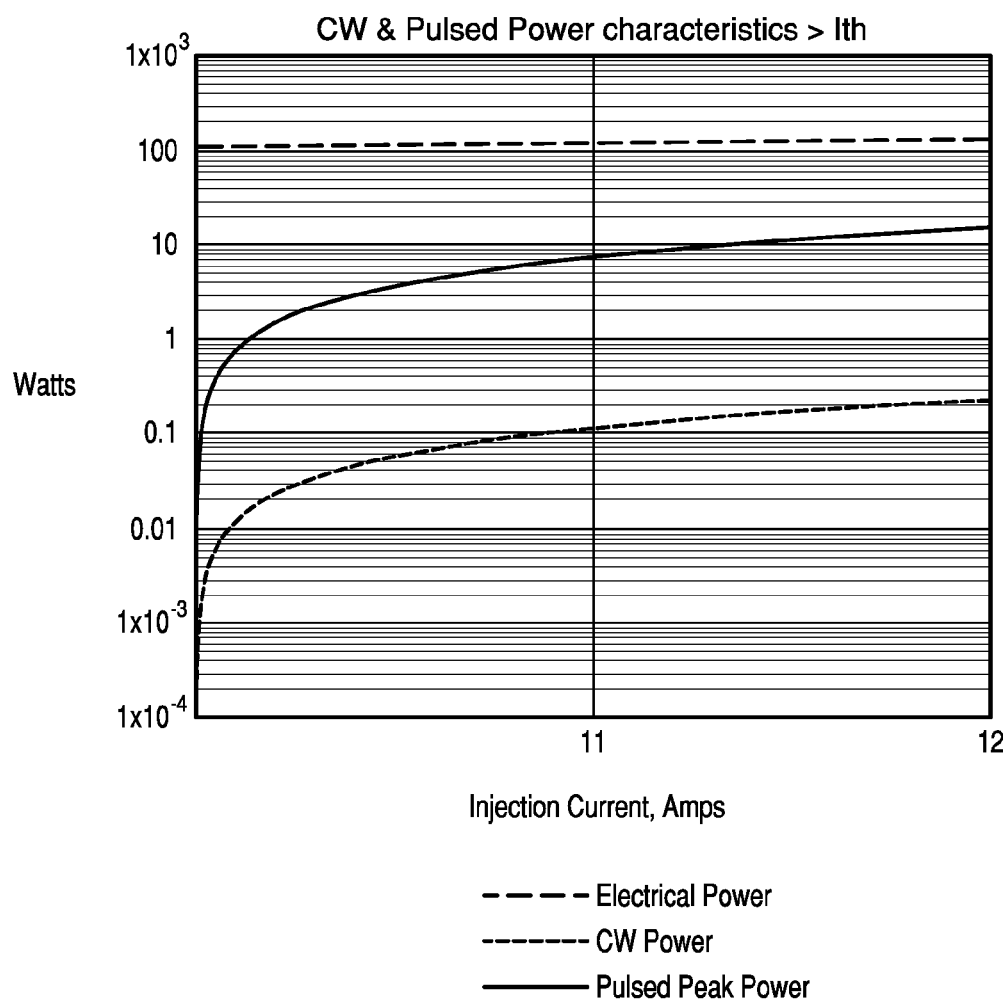
FIG. 1 is a graph comparing the calculated output power of a CW THz laser and a passive mode locked version of that laser for an input electrical input power of about 100 W as function of injection current.

The references cited herein are incorporated by reference in their entirety.

The present inventors have realized that for providing a pulsed THz laser, instead of a CW laser, the power output can be significantly increased with a substantial decrease in the drive current required.

Problems with CW Mode Lasing for THz Emission

As background, the deleterious effects of trying to make a semiconductor laser with a threshold current of even 10$^4$ Amps/cm$^2$ in CW mode is described. A reflectivity of the lasing mirrors of ~100% and 95% to form the lasing cavity is assumed. To achieve a threshold current of 10$^4$ Amps/cm$^2$, there is needed a typical loss-per-cm in the laser cavity of around 200 cm$^{-1}$, and a typical gain factor of around 0.1 cm/Amp. These are not unreasonable numbers in semiconductor laser physics for CW operation.

Because of the very long wavelength for THz radiation, a cavity length of ~10 mm is chosen to be consistent with the required lasing volume calculated for a magnon laser, such as that of Korenblit and Tankhilevich. This provides a required mode cross section of ~3.3 mm, which is consistent with a requirement for single transverse mode lasing, mode TEM$_{00}$ for ~1 mm wavelength output. For ~0.3 THz operation, i.e., ~900 microns wavelength, even assuming an internal quantum efficiency of 80% and an optimistic theta-temperature, θ, the external quantum efficiency is around 10$^{-1}$%. The theta-temperature, θ, is given by the equation: $J_{Th} = J_0 e^{(T/\theta)}$, where $J_{Th}$ is the threshold current density at a temperature T, and $J_0$ is the threshold current density at a temperature T=0. The theta-temperature, θ, typically ranges from 50° to 110° for semiconductor laser diodes.

The above parameters are not usable for CW output. Using the estimates of Korenblit and Tankhilevich for the threshold current, along with a typical lasing geometry for the desired laser wavelength in the THz regime indicates that the CW lasing will not work for a single mode, because the losses in the laser cavity would be too high, and the temperature rise of the active region of the laser would result in rapid vaporization of the material. Thus, such as CW laser with the required kiloAmps of drive current would not be feasible.

Pulsed Lasing for THz Emission

As mentioned above, the present inventors have realized that by providing a pulsed THz laser, instead of a CW laser, the power output can be significantly increased with a substantial decrease in the drive current required. Thus, such a pulsed laser is feasible.

In general, for a semiconductor laser design, pulsed semiconductor lasing can be achieved by known methods, such as for example, gain switching, Q-switching, mode-locking, and cavity dumping. Some of these techniques may be combined, such as for example, gain switching and mode-locking. In exemplary embodiments of the pulsed THz emitter as described, passive mode-locking, using a saturable absorber material positioned adjacent to the rear (high-reflecting) mirror of the laser cavity may be used.

For a laser design, a relatively low power CW laser geometry may be employed, along with modelocking to magnify the CW power into a relatively high power pulsed laser output. One exemplary design of such a relatively low power CW laser geometry for a magnon laser is as follows. To obtain the low power lasing, the width of the active region may be reduced to on the order of about 10 microns, with a cavity around 10 mm in length. Such an active region and cavity size will provide a CW laser emitting in the THz regime at about 0.3 THz, with about a mW output power for 100 Watts of electrical input power. For such a CW laser, the confinement factor would be only ~0.2 for gain guiding. This design would be feasible for low power operation of a hand held laser device, where a heatsink could be employed to dump nearly all of the 100 Watts of input power.

FIG. 1 compares the calculated output power of a CW THz laser for the magnon laser geometry described above and a passive mode locked version of that laser geometry for an input electrical input power of about 100 W as function of injection current. The top curve shows the electrical power, which is about 100 W, while the bottom and middle curves illustrate the output power of the CW THz laser, and peak pulsed output for the mode locked version, respectively. The peak output power for the mode locked version is predicted from the mode locking of approximately 67 modes inside a 10 mm long cavity tuned for 0.3 THz. As can be seen, the output power for the mode locked version is almost two orders of magnitude larger than that for the CW THz laser alone. For example, 20 mW output power for the CW laser becomes ~1 Watt peak pulsed output for the mode locked version, and 100 mW output power for the CW laser becomes ~7 Watt peak pulsed output for the mode locked version. Thus, it is predicted that the peak pulsed output for the mode locked version is much greater than the output power for the CW laser alone.

Passive Mode Locking

As mentioned above, pulsed lasing may be achieved based on a number of mechanisms, such as for example, gain switching, Q-switching, mode locking, and cavity dumping. The mode locking may be AM and FM active mode locking, or passive mode locking.

In this section, there is described pulsed lasing based on passive mode locking, and in particular passive mode locking for a semiconductor magnon laser. For the CW laser geometry, we use the exemplary design discussed above of a relatively low power CW magnon laser with the width of the active region of about 10 microns, and a cavity around 10 mm in length, where such an active region and cavity size will provide a CW laser emitting in the THz regime at about 0.3 THz. We further assume the semiconductor material of the cavity has a refractive index of ~3.0 at THz frequencies.

For such a design, the pulse lasing performance may be estimated based on standard equations for mode locked semiconductor lasers, with the following parameters:

Pulse round-trip time=0.2 nanoseconds;
Pulse Repetition Frequency=5000 MHz
Number of pulses per 16.6 ms TV line scan=83 million (on order of 10,000 pulses per pixel;
Number of longitudinal modes in the cavity=67;
Pulse-width=3 picoseconds;
Spatial period of pulses: 0.06 meters;
Pulse length: 0.9 millimeters; and
Duty cycle: 0.015.

For this lasing geometry and operating parameters, 20 mW output power for the CW laser becomes ~1 Watt peak pulsed output for the mode locked version, and 100 mW output power for the CW laser becomes ~7 Watt peak pulsed output for the mode locked version as shown in FIG. 1.

Thus, this lasing geometry provides a 0.9 mm wavelength (0.3 THz) laser, which outperforms comparable THz lasers. If the peak pulsed power is only 1 Watt, which corresponds to an average THz output power of about 20 mW, even at lasing efficiency of <1%, the average electrical power requirement is just ~100 W. For 7 W of peak pulsed power, the average electrical power requirement is just ~130 W. Thus, this laser design with passive mode locking provides a reasonable peak pulsed output power for a reasonable average electrical power requirement. By contrast, lengthening the laser cavity merely increases the electrical power requirement, for little extra optical power output in the THz regime, even though the mode number is increased.

Figure 2:
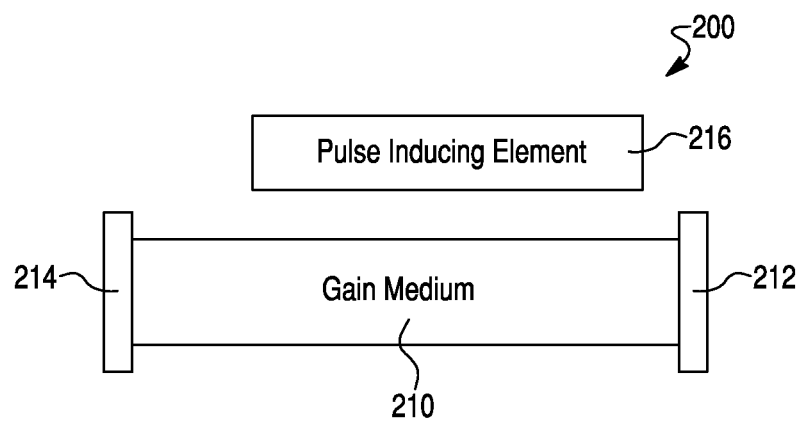
FIG. 2 is a schematic illustrating a pulsed emitter of electromagnetic radiation in the THz regime according to an embodiment of the invention.

FIG. 2 is a schematic illustrating the general concept a pulsed emitter of electromagnetic radiation in the THz regime according to an embodiment. The pulsed emitter 200 emits radiation in a frequency range of 0.1 to 10 THz. The pulsed emitter 200 includes an electromagnetic radiation gain medium 210 for generating electromagnetic radiation having the frequency range of 0.1 to 10 THz. The gain medium 210 may comprise, for example, material for an active magnum region. Appropriate materials for the active magnon regions are described, for example, in U.S. Pat. Nos. 7,471,449, 7,508,578, 7,706,056, 7,430,074, and 7,440,178 to Korenblit and Tankhilevich, which are incorporated by reference herein in their entirety. The active magnon regions may include, for example, multiple stripes of ferromagnetic semiconductor material, which are confined by magnon mirrors. The ferromagnetic semiconductor may be EuO, for example. The pulsed emitter 200 may include a highly reflecting back mirror 212 and a front mirror 214 to reflect the radiation emitted from the gain medium 210.

The pulsed emitter 200 further includes a pulse inducing element 216 configured to induce an electromagnetic radiation pulse in the gain medium 210. The radiation pulsing may be achieved based on a number of mechanisms, such as for example, gain switching, Q-switching, mode locking, and cavity dumping. The mode locking may be AM and FM active mode locking, or passive mode locking. Preferably the radiation pulsing is achieved by passive mode locking.

Figure 3:
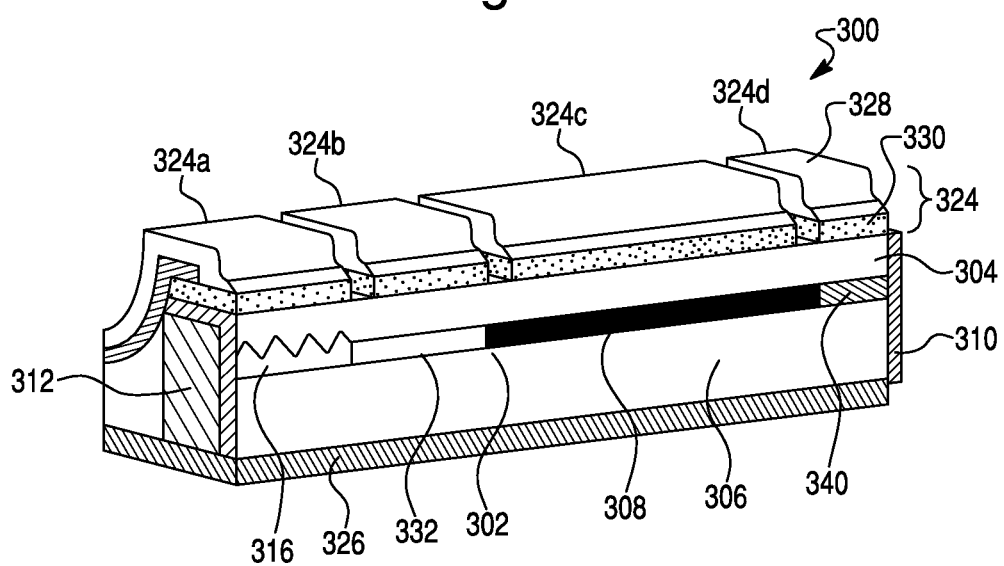
FIG. 3 is a cross sectional view of a pulsed emitter of electromagnetic radiation in the THz regime, where the pulsed emitter is a monolithic mode-locked diode laser, according to an embodiment of the invention.

FIG. 3 illustrates an embodiment of a pulsed emitter of electromagnetic radiation in the THz regime, where the pulsed emitter is a monolithic mode-locked diode laser (MMDL). The pulsed emitter 300, which is an MMDL, includes a gain medium in the laser cavity 302, where laser cavity material comprises active magnon regions 308. For THz laser radiation, the laser cavity may be, for example, about 10 mm in length. Appropriate materials for the active magnon regions 308 are described, for example, in U.S. Pat. Nos. 7,471,449, 7,508,578, 7,706,056, 7,430,074, and 7,440,178 to Korenblit and Tankhilevich, which are incorporated by reference herein in their entirety. The active magnon regions 308 include, for example, multiple stripes of ferromagnetic semiconductor material, which are confined by magnon mirrors. The ferromagnetic semiconductor may be EuO, for example. The stripes run as axial stripes along the length of the MMDL to comprise the active magnon regions 308, which are between the axially running magnon mirror strips, which confine the magnons. Preferably the surfaces are smooth to ~1 nm or less.

Top waveguide 304 and bottom waveguide 306 are arranged above and below the laser cavity 302, respectively. The waveguides 304 and 306 may comprise, for example, a semiconductor material such as n or p doped InP. The waveguides 304 and 306 confine the lasing radiation to travel within the laser cavity 302.

A highly reflecting back mirror 310 and a front mirror 312 reflect the lasing radiation emitted from the laser cavity 302. The highly reflecting back mirror 310 may be, for example, a coating of $Al_2O_3$/Au. The front mirror 312, may be, for example, $SiO_2$.

Optionally, the pulsed emitter 300 may include a distributed Bragg reflector (DBR) 316 arranged in the laser cavity 302 between the active magnon regions 308 and the front mirror 312. The DBR 316 provides wavelength tuning and laser line stability functions.

Optionally, the pulsed emitter 300 may include multiple quantum well (MQW) regions in addition to the magnon active regions, where the MQW regions are positioned in and around the active regions 308, according to the functionality required by the design and performance optimization. The MQW regions may be InGaAs quantum wells separated by InGaAs barriers, as a separate graded index heterostructure.

The pulsed emitter 300 may have a top contact 324 and a bottom contact 326. The bottom contact 326 underlies the bottom waveguide 306. The bottom contact 326 may comprise, for example, a gold alloy, and may be AuGeNi/Au or Au/Zn.

The top contact 324 may have a metal contact layer 328 and a semiconductor contact layer 330 between the metal contact layer 328 and the top waveguide 304. The metal contact layer 328 may comprise, for example, a gold alloy, and may be AuGeNi/Au or Au/Zn. The semiconductor contact layer 330 may be, for example, InGaAs.

The top contact 324 may be divided into contact regions 324a, 324b, 324c and 324d. The contact region 324a is positioned above the DBR 316. The contact region 324b is positioned above a passive waveguide 332, which is between the DBR 316 and the active magnon regions 308. The contact regions 324a and 324b respectively provide DBR control and phase control. The contact region 324c is positioned above the laser cavity 302, and provides a gain function.

The pulsed emitter 300 also includes a passive saturable absorber 340 arranged in the laser cavity 302 between the back mirror 310 and the active magnon regions 308. In passive mode locking the saturable absorber 340 has a decreased absorption coefficient when lower intensity light passes through the saturable absorber 340, and an decreased absorption coefficient when higher intensity light is passing through the saturable absorber 340. Pulse widths achieved by employing the passive mode locking with the saturable absorber are usually a few picoseconds in solids. The use of a saturable absorber is described, for example, in [A. E. Siegman, 1986]. The saturable absorber 340 may be, for example, GaAs, GaP, or Ge. The thickness of the saturable absorber 340 along the length of the laser cavity 302 may be on the order of 100 microns, for example.

Applications

The pulsed emitter which emits electromagnetic radiation in the THz regime, as described above, has a number of applications, including for use in explosives and drug detection, communications, remote imaging of interiors of structures such as buildings, and Laser Radar (LADAR) imaging.

For remote imaging, electromagnetic radiation from a pulsed emitter in the range 0.1 to 0.3 THz penetrates building materials quite well. Thus, an imaging system based on the THz regime pulsed emitter described above may non-invasively and remotely determine the contents of buildings at about a 100 meter range, for example, and provides the possibility of identifying a low contrast target that might be presented in the presence of strong THz radiation scattering. The relatively low input electrical power requirements of the pulsed emitter described provides the possibility of a hand held imaging system, such as an SLR camera type imager, with a THz detector and pulsed emitter, with appropriate optics. Optics for such an SLR camera type imager may include, for example, a 4 inch lens at f/2.

For LADAR applications, the THz regime pulsed emitter described above, along with time gated return analysis offers the possibility of 3-dimensional imaging. The time gating of the detector synchronized with the THs emission, provides advantages for such detection.

Figure 4:
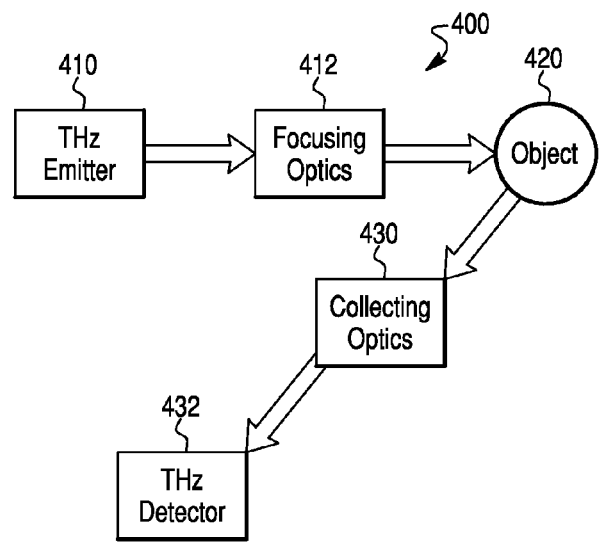
FIG. 4 is a schematic of an optical imaging system according to an embodiment of the invention.

FIG. 4 illustrates an optical imaging system 400 according to an embodiment of the invention. The optical imaging system 400 includes a THz pulsed emitter 410 which emits THz radiation in the THz regime, such as the THz pulsed emitter described above. The optical imaging system 400 further includes a THz detector 432 which detects electromagnetic radiation in the THz regime. The THz detector 432 may be, for example, a Schottky diode or a heterodyne detector. The THz detector 432 may be a detector as described, for example, in U.S. patent application Ser. No. 13/243,342, entitled NANO-STRUCTURE ARRAYS FOR EMR IMAGING, filed Sep. 23, 2011, which is incorporated by reference in its entirety.

The optical imaging system 400 also includes focusing optics 412 to focus THz electromagnetic radiation emitted by the THz pulsed emitter 410 onto an object 420 to be investigated. The focusing optics may include lens and/or mirrors. The THz electromagnetic radiation from the object 420 is collected by collecting optics 430 and imaged onto the THz detector 432.

Figure 5:
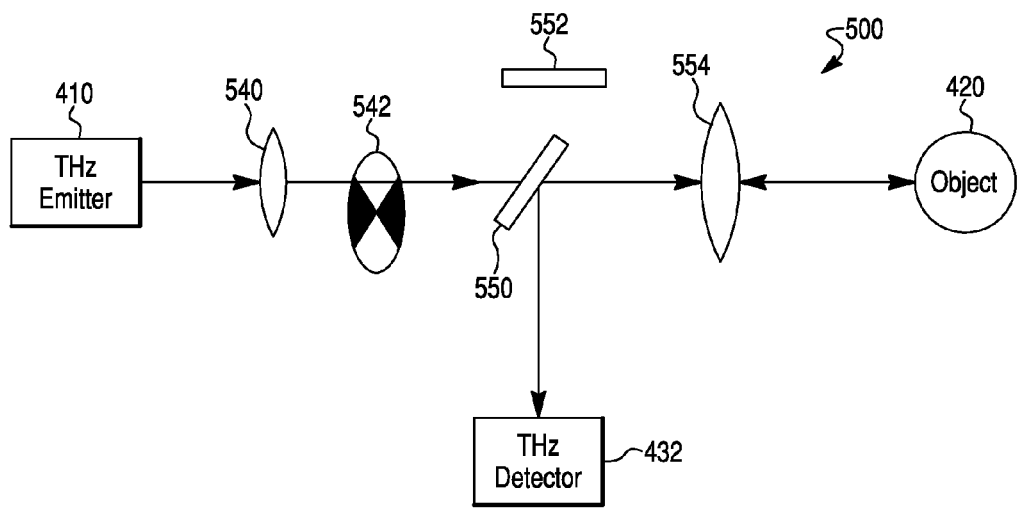
FIG. 5 is a schematic of an optical imaging system according to another embodiment of the invention.

FIG. 5 illustrates an optical imaging system 500 according to another embodiment of the invention. The optical imaging system 500 includes a THz pulsed emitter 410 which emits THz radiation in the THz regime, such as the THz pulsed emitter described above. The optical imaging system 500 further includes a THz detector 432 which detects electromagnetic radiation in the THz regime. The THz detector 432 may be, for example, a Schottky diode or a heterodyne detector. The THz detector 432 may be a detector as described, for example, in U.S. patent application Ser. No. 13/243,342, entitled NANO-STRUCTURE ARRAYS FOR EMR IMAGING, filed Sep. 23, 2011, which is incorporated by reference in its entirety.

The optical imaging system 500 also includes a first lens 540 to receive THz electromagnetic radiation emitted by the THz pulsed emitter 410 and to direct the THz electromagnetic radiation to a chopper 542 and then onto a beam splitter 530, which splits the electromagnetic radiation, directing a portion of the electromagnetic radiation onto a second lens 554, which is imaged on an object 420 to be investigated. The THz electromagnetic radiation from the object 420 is collected by second lens 554 and imaged onto the THz detector 432 via the beam splitter 530. In this embodiment, the second lens 554 and beam splitter 530 collectively function as the imaging optics, while the first lens 540, beam splitter 530, and second lens 554, collectively function as the focusing optics.

Figure 6:
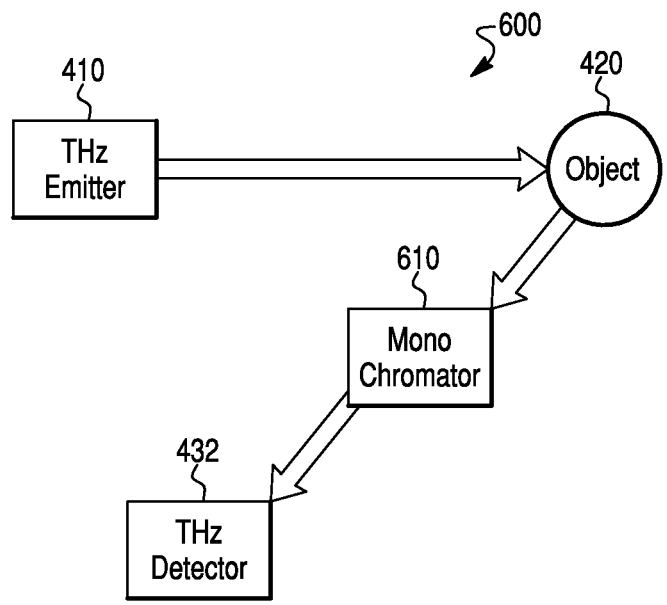
FIG. 6 is a schematic of a remote sensing system according to an embodiment of the invention.

FIG. 6 illustrates an remote sensing system 600 according to an embodiment of the invention. The remote sensing system 600 includes a THz pulsed emitter 410 which emits THz radiation in the THz regime, such as the THz pulsed emitter described above. The THz pulsed emitter 410 directs THz radiation onto an object 420 to be investigated. The remote sensing system 600 further includes a THz detector 432 which detects electromagnetic radiation in the THz regime. The THz detector 432 may be, for example, a Schottky diode or a heterodyne detector. The THz detector 432 may be a detector as described, for example, in U.S. patent application Ser. No. 13/243,342, entitled NANO-STRUCTURE ARRAYS FOR EMR IMAGING, filed Sep. 23, 2011, which is incorporated by reference in its entirety.

The remote sensing system 600 also includes a monochromator 610, which receives THz radiation from the object 420, and discriminates and passes the received THZ radiation within a spectral band. The passed THz electromagnetic radiation is imaged onto the THz detector 432.

Figure 7:
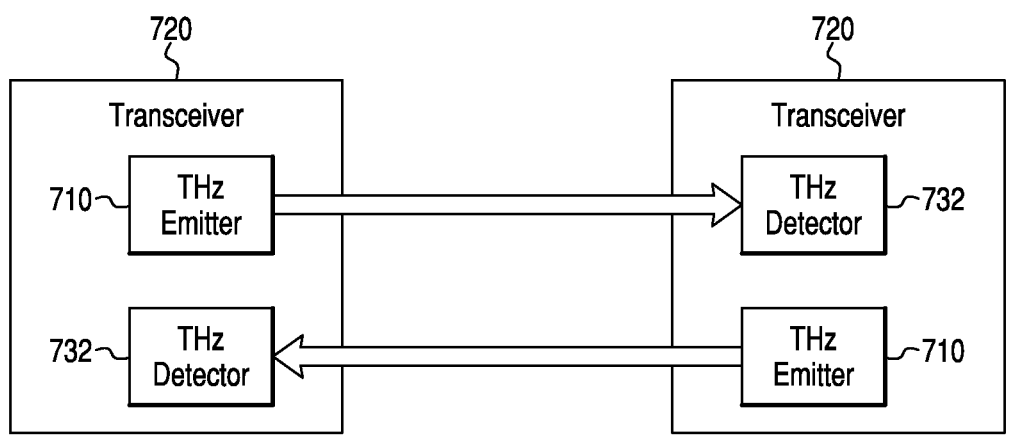
FIG. 7 is a schematic of a telecommunication system according to an embodiment of the invention.

FIG. 7 illustrates a telecommunication system 700 according to an embodiment of the invention. The telecommunication system 700 includes one or more transceivers 720. Each transceiver 720 includes a THz pulsed emitter 710 which emits THz radiation in the THz regime, such as the THz pulsed emitter described above. Each transceiver 720 also includes a THz detector 732 which detects electromagnetic radiation in the THz regime. The THz detector 732 may be, for example, a Schottky diode or a heterodyne detector. The THz detector 732 may be a detector as described, for example, in U.S. patent application Ser. No. 13/243,342, entitled NANO-STRUCTURE ARRAYS FOR EMR IMAGING, filed Sep. 23, 2011, which is incorporated by reference in its entirety.

Each transceiver 720 communicates by directing THz radiation from its THz pulsed emitter 710 to another of the transceivers, and detecting THz radiation received by another of the transceivers by its THz detector 732.

The invention claimed is:

1. A pulsed emitter of electromagnetic radiation having a frequency range of 0.1 to 0.3 THz, comprising:
   an electromagnetic radiation lasing gain medium comprising ferromagnetic semiconductor material; and
   a pulse inducing element configured to introduce an electromagnetic radiation laser pulse in the electromagnetic radiation lasing gain medium to cause the electromagnetic radiation lasing gain medium to generate electromagnetic lasing radiation having a frequency range of 0.1 to 0.3 THz,
   wherein the pulsed emitter is a laser,
   wherein the pulsed emitter is configured to provide about 7 Watts of peak pulsed output power for an input electrical power of about 100 W input to the pulsed emitter.

2. The pulsed emitter of electromagnetic radiation of claim 1, wherein the pulse inducing element is configured to induce the pulse by at least one of gain switching, Q switching, cavity dumping or mode-locking, or a combination thereof.

3. The pulsed emitter of electromagnetic radiation of claim 1, wherein the pulse inducing element comprises a saturable absorber configured to induce the pulse by passive mode-locking.

4. The pulsed emitter of electromagnetic radiation of claim 3, wherein the saturable absorber comprises a semiconductor material.

5. The pulsed emitter of electromagnetic radiation of claim 4, wherein the semiconductor material of the semiconductor material comprises at least one of GaAs, GaP, or Ge.

6. The pulsed emitter of electromagnetic radiation of claim 1, wherein the pulse inducing element is configured to provide a pulse repetition frequency of greater than 1 MHz, a pulse width on the order of picoseconds, and a pulse length on the order of 0.1 mm or more.

7. The pulsed emitter of electromagnetic radiation of claim 6, wherein a number of longitudinal modes in a laser cavity of the pulsed emitter is greater than one.

8. A remote sensing system, comprising: the pulsed emitter of electromagnetic radiation of claim 1 arranged to direct electromagnetic radiation towards an object; and a detector arranged to detect electromagnetic radiation from the object in the frequency range of 0.1 to 0.3 THz.

9. The remote sensing system of claim 8, further comprising:
   a monochromator arranged to receive electromagnetic radiation from the object and to pass a spectral band of the received electromagnetic radiation to the detector.

10. An optical imaging system, comprising: the pulsed emitter of electromagnetic radiation of claim 1 arranged to direct electromagnetic radiation towards an object; collecting optics arranged to receive electromagnetic radiation from the object; and a detector arranged to detect electromagnetic radiation imaged from the collecting optics in the frequency range of 0.1 to 0.3 THz.

11. The optical imaging system of claim 10, wherein the collecting optics comprises at least a lens or a mirror.

12. The optical imaging system of claim 10, further comprising:
   focusing optics arrange to receive electromagnetic radiation from the pulsed emitter and focus the received electromagnetic radiation onto the object.

13. The optical imaging system of claim 12, wherein the focusing optics comprises at least a lens or a mirror.

14. The optical imaging system of claim 10, wherein the optical imaging system is a two-dimensional or a three-dimensional LADAR.

15. A telecommunication system, comprising: at least one transceiver comprising: the pulsed emitter of electromagnetic radiation of claim 1; and a detector arranged to detect electromagnetic radiation emitted from the pulsed emitter in the frequency range of 0.1 to 0.3 THz.

* * * * *